United States Patent [19]
Cho

[11] Patent Number: 5,648,298
[45] Date of Patent: Jul. 15, 1997

[54] METHODS FOR FORMING A CONTACT IN A SEMICONDUCTOR DEVICE

[75] Inventor: Gyung-Su Cho, Kyoungki-do, Rep. of Korea

[73] Assignee: Hyundai Electronics Industries Co., Ltd., Ichon, Rep. of Korea

[21] Appl. No.: 610,718

[22] Filed: Mar. 4, 1996

[30] Foreign Application Priority Data

Mar. 4, 1995 [KR] Rep. of Korea ............ 95-4444
Mar. 4, 1995 [KR] Rep. of Korea ............ 95-4451

[51] Int. Cl.⁶ ............................................ H01L 21/44
[52] U.S. Cl. .................... 437/187; 437/195; 437/203; 437/228; 156/644.1; 156/652.1
[58] Field of Search ............................ 437/187, 195, 437/203, 228, 189; 156/644.1, 652.1

[56] References Cited

U.S. PATENT DOCUMENTS

| | | | |
|---|---|---|---|
| 4,560,435 | 12/1985 | Brown et al. | 437/195 |
| 4,717,449 | 1/1988 | Erie et al. | 156/644.1 |
| 5,126,006 | 6/1992 | Cronin et al. | 156/644.1 |
| 5,187,121 | 2/1993 | Cote et al. | 437/195 |
| 5,461,004 | 10/1995 | Kim | 437/228 |
| 5,466,636 | 11/1995 | Cronin et al. | 437/187 |
| 5,488,013 | 1/1996 | Geffken et al. | 437/195 |

*Primary Examiner*—Tuan H. Nguyen
*Attorney, Agent, or Firm*—Ware, Fressola, Van Der Sluys & Adolphson LLP

[57] ABSTRACT

A method of forming a contact of a semiconductor device is disclosed. An insulating film and a metal oxide film having different etch rates are deposited on a semiconductor substrate. A photoresist pattern is formed so that the width thereof is the minimum line width which can be obtained using a conventional exposure equipment. When the insulating film and metal oxide film are etched using the photoresist pattern, since the etch rates are different from one another, a contact hole is formed than that is a finer than that at a conventional contact hole. Accordingly, a fine contact can be manufactured without purchasing additional equipment, and can be applied for semiconductor devices with higher integration.

15 Claims, 6 Drawing Sheets

METHODS FOR FORMING A CONTACT IN A SEMICONDUCTOR DEVICE

FIELD OF THE INVENTION

The present invention relates to methods for forming a contact in a semiconductor device, and more particularly, to methods for forming the contact in the semiconductor device for which a contact hole, finer than that formed using a conventional or selected photolithography process, using the thin films having differential etch rates.

BACKGROUND OF THE INVENTION

The current semiconductor technology requires semiconductor devices with higher integration as well as higher operational speed. In accordance with such demands, there is increasing need for a semiconductor device with a fine pattern.

In general, the contact hole is formed between conductive layers in order to electrically connect them. Then, the contact hole is filled with conductive material, which comes into contact with a substrate. According to such a conventional contact method, as shown in FIG. 1, an insulating film 2 is formed on the semiconductor substrate or conductive film 1, and the upper surface of the insulating film is coated with a photoresist film (not shown). Next, in order to expose a predetermined contact hole portion at the minimum size which can be attained by conventional or selected exposure equipment, the photoresist pattern 3 is formed by a photolithography process through exposure and development. The insulating film 2 exposed in the form of the photoresist pattern (not shown) is etched according to the conventional photolithography process, thereby forming the contact hole and exposing a predetermined portion of the semiconductor substrate or the conductive layer 1. Photoresist pattern is removed by a conventional method. Afterwards, a metal layer is deposited on the overall surface of the resultant structure so that the exposed semiconductor substrate is in contact with the metal layer.

In the contact forming process using the photolithography process as described above, it is well known that the formation of the contact hole using the photoresist pattern is closely related to the diffraction of light. For example, resolution, which is the minimum pattern width formed using the photolithography process, is an important variable and determined by the following Rayleigh's equation.

$$R = k(\lambda/NA)$$

Here, R is the resolution; $\lambda$ is an exposure wavelength, NA is the lens' numerical aperture of the exposure equipment, and k is a constant adjusted according to the process condition. As a variable in accordance with a process capability, k is about 0.7 in a mass production step. Furthermore, an I-line of a light source used mainly in the mass production step has a wavelength of about 0.356 μm, and a G-line has a wavelength of 0.436 μm. In the case where the numerical aperture of the lens of the general exposure equipment is 2, the width of the photoresist pattern is about 0.5 μm to 0.6 μm, according to the above equation.

However, in the case where photoresist pattern width produced by the above Rayleigh's equation is applied to semiconductor devices pursuing higher integration, there are the following problems.

As the effective channel length of the semiconductor device is reduced to 0.5 μm or less, the size and depth of the junction region are also reduced in proportion to the effective channel length. Because of the smaller proportions, even a slight misalignment during the formation process of the contact hole can expose the junction region of the semiconductor substrate, and the gate electrode adjacent to the junction region is degraded. Thus, an interconnection on line can arise resulting in the shorting of the circuit elements.

In order to solve the aforementioned problem, it is necessary to increase the exposure wavelength and the lens' numerical aperture of the exposure equipment, according to the Rayleigh's equation. In order to achieve these increase, new and expensive exposure equipment is required, and accordingly the manufacturing cost of the device is increased.

SUMMARY OF THE INVENTION

It is an object of the present invention to provide a method for forming a contact of a semiconductor device in which a contact hole having a smaller size than the minimum line width of the photoresist pattern that can be formed by using conventional or any selection exposure equipment, without the need for purchasing the additional equipment.

The above object can be accomplished according to a first embodiment of the present invention. In the first embodiment of the present invention, first and second films which are different from each other are formed on a semiconductor substrate. A first photoresist pattern is formed on the second film and the second film is etched by the first photoresist pattern. After removing the first photoresist pattern, a first hole is formed in a remainder of the second film. On remainder of the second film, a third film having an etch rate slower than those of the first and second films is formed so as to fill the first hole. The third film is removed until the second film and the first hole filled with the third film exposed. A second photoresist pattern is formed so as to expose a limited area where the remainder of the second film and the first hole filled with the third film are in contact with each other. The third film, the second film and the first film are etched using the second photoresist pattern to expose the semiconductor substrate, thereby forming a contact hole. The second photoresist pattern is then removed. Afterwards, a contact plug is formed in the contact hole. A metal interconnection line is formed on the second film so as to be in contact with the contact plug, thereby forming a contact in a semiconductor device.

Alternatively, the above object can be accomplished according to a second embodiment of the present invention. In the second embodiment of the present invention, first and second films which are different from each other are formed on a semiconductor substrate. A first photoresist pattern is formed on the second film. The second film is then etched by the first photoresist pattern. Next the first photoresist pattern is removed, thereby forming a first hole in a remainder of the second film. On the entire resultant structure, a third film having an etch rate slower than those of the first and the second films is formed so as to fill the first hole and cover the remainder of the second film. The third film is removed until the second film and first hole filled with the third are exposed film. In order to protect the third film, a fourth film having an etch rate faster than that of the third film is then formed on the entire resultant structure. Next a second photoresist pattern is formed so as to expose the fourth film corresponding to a limited area where the second film is in contact with the third film. The fourth, third, second and first films may then be sequentially etched using the second photoresist pattern, thereby forming a contact hole. The second photoresist pattern and the unetched fourth film are then removed, and a contact plug is formed in the contact hole. Afterwards, a metal interconnection line is formed so as to be in contact with the contact plug, thereby forming a contact in a semiconductor device.

Alternatively, the above object can be accomplished according to a third embodiment of the present invention. In the third embodiment of the present invention, a first film is formed on a semiconductor substrate, and a predetermined portion of the first film is etched using a first photoresist pattern which is removed. A second film having an etch rate faster than that of the first film is deposited on the resultant structure. A second photoresist pattern is formed on the second film so that the area of the second film which lies directly above the etched region of the first film, is exposed. The second film is then etched by the photoresist pattern, and the second photoresist pattern is removed. A third film having an etch rate faster than those of the first and second films is formed on the entire resultant structure. The third film is etched using a third photoresist pattern so as to be in line with the etch border of the first film, thereby forming a contact hole. The third photoresist pattern is removed. Afterwards, a contact plug is formed in the contact hole, the structure is planarized, and a metal interconnection line is formed so as to be in contact with the contact plug, thereby forming a contact in a semiconductor device.

BRIEF DESCRIPTION OF THE DRAWINGS

The novel features believed characteristic of the invention are set forth in appended claims. The invention itself, however, as well as our features advantage thereof, will be better understood with the reference to the following detailed description, read in conjunction with the accompanying drawings, wherein:

DETAILED DESCRIPTION OF THE INVENTION

Hereinafter, preferred embodiments of the present invention will be described with reference to the attached drawings.

FIGS. 2 to 7 are cross-sectional views of a semiconductor device showing a sequence of steps in forming a contact of a semiconductor device, according to a first embodiment of the present invention.

Figure 2:
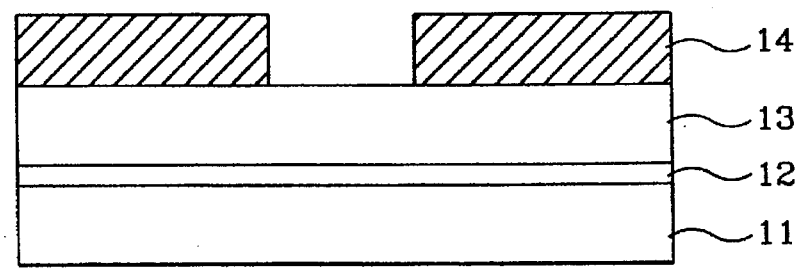
FIGS. 2 to 7 are cross-sectional views of a semiconductor device showing a sequence of steps in forming a contact of a semiconductor device, according to a first embodiment of the present invention.

To begin with, as shown in FIG. 2, a first film 12 and a second film 13 are formed on a semiconductor substrate 11. Semiconductor substrate 11 is a single-crystalline silicon substrate or an epitaxial silicon body. The semiconductor substrate 11 may be implanted with impurity atoms of N-type or P-type. Further, a basic electrode and a metal interconnection line may be formed on the semiconductor substrate 11. Preferably, the first film 12 and the second film 13 are insulating films having different properties. In order to form first film 12 and second film 13 so as to have a different properties, when depositing the first film 12 and the second film 13 a method may be used where the respective films are deposited by means of different deposition equipment such as, a plasma enhanced chemical vapor deposition (PECVD), a low pressure chemical vapor deposition (LPCVD) or an atmosphere pressure chemical vapor deposition (APCVD). Alternatively, a method may be used where the films are respectively formed as a low temperature oxide film and a high temperature film by graduating the deposition temperature. Alternatively once more, a method may be used where the films are respectively formed as a film formed by differentiating the quantity or kind of gases constituting the film such as, a borophosphosilicate glass (BPSG), a Phosphosilicate glass (PSG) or a metal oxide film.

A first photoresist pattern 14 is formed on the second film 13. At this time, the width of the first photoresist pattern 14 is formed at a minimum distance which can be attained by using a conventional exposure equipment or any selected exposure equipment.

Figure 3:
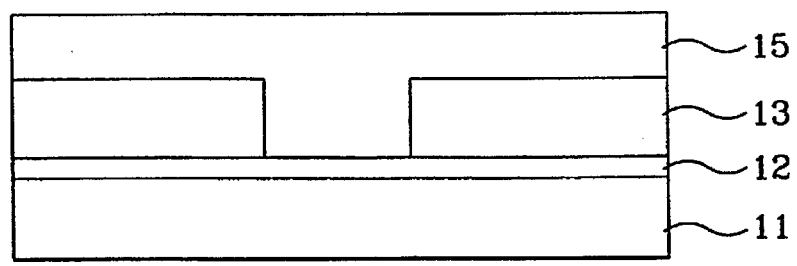

As shown in FIG. 3, the second film 13 is etched using the first photoresist pattern 14, thereby forming a first hole in a remainder of the second film. After removing the first photoresist pattern 14 through a plasma ashing method, a third film 15 is deposited on the entire resultant structure. At this time, the third film 15 is a film having an etch rate slower than those used for the first film 12 and film 13. For the third film 15, a nitride film, a oxynitride film, a metal oxide film, or a metal thin film can be used.

Figure 4:
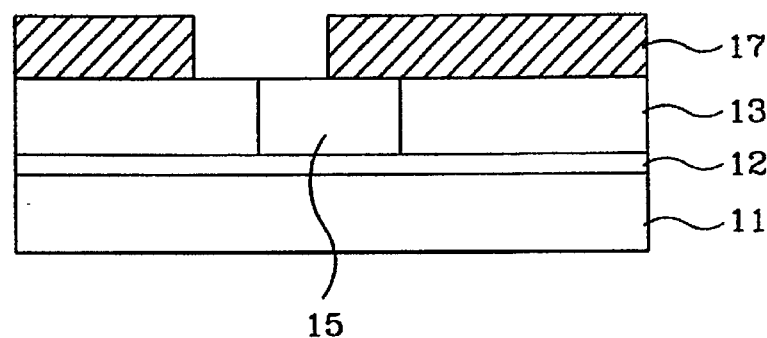

As shown in FIG. 4, the third film 15 fills the inside of the first hole using an anisotropic blanket etching method or a chemical mechanical polishing method. Then, on the entire resultant structure, a second photoresist pattern 17 is formed so as to simultaneously expose a limited area where the second film 13 and the third film 15 are in contact with each other. At this time, like the first photoresist pattern, a second photoresist pattern 17 is formed so that the width thereof is of minimum distance.

Figure 1:
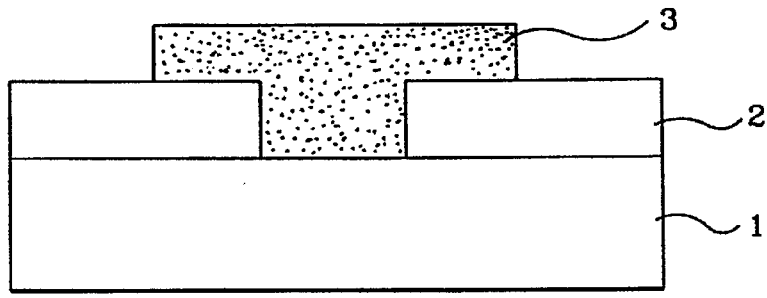
FIG. 1 is a cross-sectional view of a contact of a semiconductor device formed using a conventional method.
Figure 5:
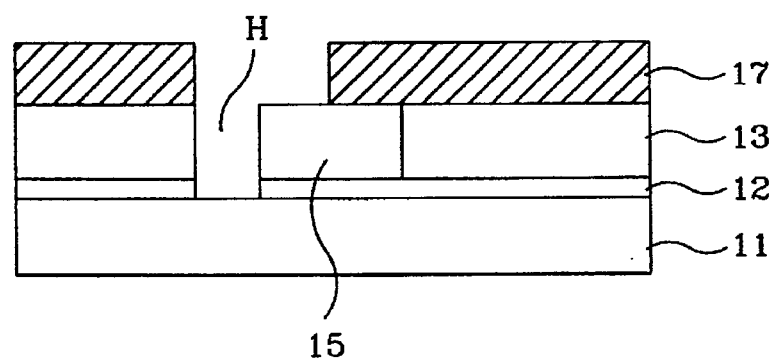

As shown in FIG. 5, the exposed second film 13 is etched using the second photoresist pattern 17. The exposed first film 12 resulting from the etched second film 13 is also etched using the second photoresist pattern 17. Therefore, a contact hole H exposing a portion of the semiconductor substrate 11 is formed. At this time, the third film 15 is exposed along with the second film 13. However, since the etch rate of third film 15 is much slower than those of the first and second films 12 and 13 as described above, it is etched to a minute degree. Similarly, since the third film 15 is much more slowly etched than the first and the second films 12 and 13, contact hole H is formed such that the diameter is a smaller size than the minimum diameter which can be attained using the known photolithography process described in connection with FIG. 1.

Figure 6:
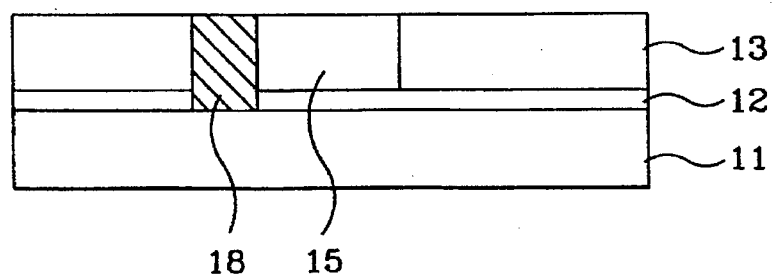

As shown in FIG. 6, the second photoresist pattern 17 has been removed using a conventional method. A metal plug 18 is formed in contact hole H according to a selective deposition method. For the metal plug 18, any material having conductivity can be used such as tungsten, copper, aluminum on an aluminum alloy.

Figure 7:
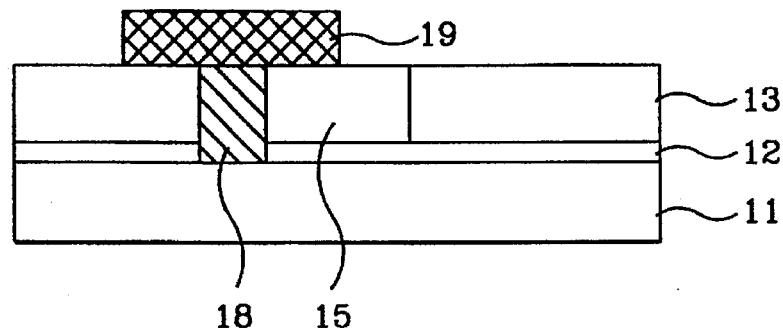

In order to have a planarized structure as shown in FIG. 7, a planarization process is carried out on the surface of the entire resultant structure remaining after the step of removing the second photoresist pattern. The planarization process may be performed using a chemical mechanical polishing (CMP) method. A metal interconnection line 19 is then formed on the entire resultant planarized structure. The metal interconnection line 19 is in contact with metal plug 18, thereby forming a contact having a fine size between the semiconductor substrate and the metal interconnection line. Furthermore, for the metal interconnection line 19, aluminum or an aluminum alloy having a good conductive ability can be used.

Figure 8:
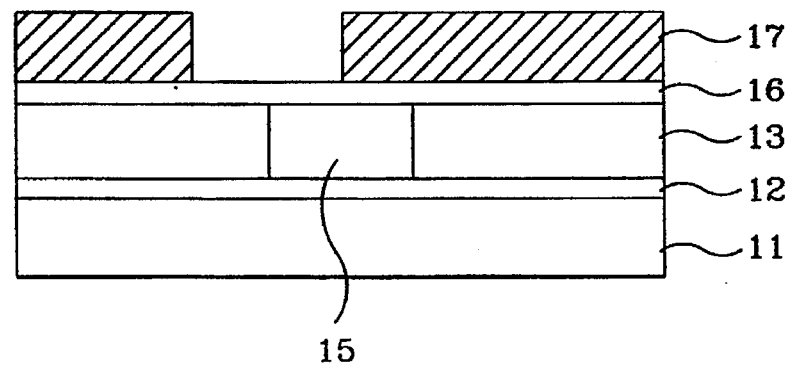
FIGS. 8 to 10 are cross-sectional views of a semiconductor device showing a sequence of steps in forming a contact of a semiconductor device, according to a second embodiment of the present invention.
Figure 9:
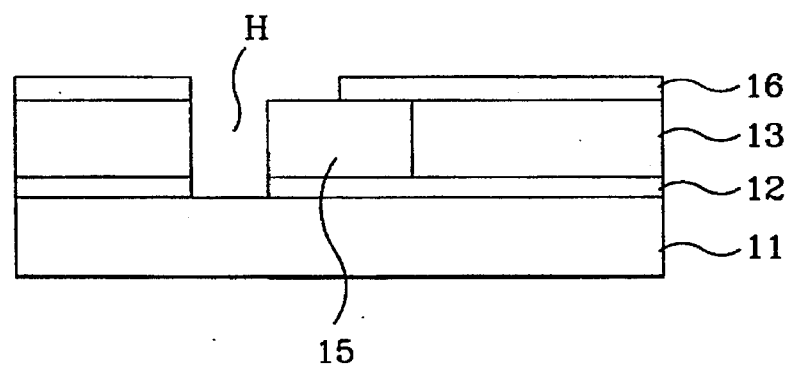
Figure 10:
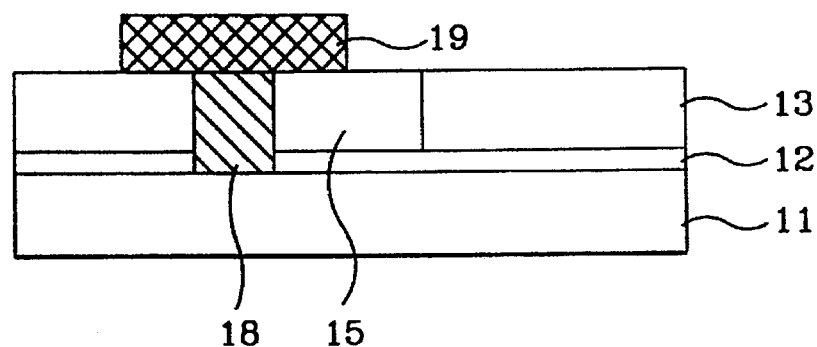

FIGS. 8 to 10 are cross-sectional views for illustrating a second embodiment of the present invention. Since the first two steps for the second embodiment are the same as the steps for FIGS. 2 and 3 of the first embodiment, the description thereof will be omitted.

As shown in FIG. 8, the third film 15 is etched using the same method as that of the first embodiment, so that it exists as a plug shape in the first hole. In order to minimize the loss of the third film 15 during the subsequent etching process, a fourth film 16 is formed on the entire resultant structure. At this time, the fourth film 16 is an insulating film having an etch rate faster than that of the third film 13. It is preferable that fourth film 16 have a similar etch rate as those of the first and second films 12 and 13. A second photoresist pattern 17 is formed on the fourth film 16 using the same method and is the same shape as those of the first embodiment.

As shown in FIG. 9, the fourth film 16, the second film 13 and the first film 12, which are exposed using second photoresist pattern 17, are etched anisotropically. At this time, because the etch rate of the third film 15 is much slower than those of the fourth film 16, the second film 13 and the first film 12 as described above, it is hardly etched as compared to the above mentioned films.

Accordingly, the diameter of a contact hole H of the present embodiment is reduced by the extent of the third film 15 which exists in the conventional contact hole. After performing the etching process, the second photoresist pattern 17 is removed using the general plasma ashing method.

FIG. 10 shows a state where the contact hole H is filled with a conductive metal material such as tungsten or aluminum using the selective metal deposition method, as in the first embodiment. Since the subsequent processes are the same as those of the first embodiment, the description thereof will be omitted.

FIGS. 11 to 18 are cross-sectional views for illustrating a third embodiment of the present invention. In the present invention, the fine contact hole is formed by using more than two kinds of materials, each having a different etch rate.

Figure 11:
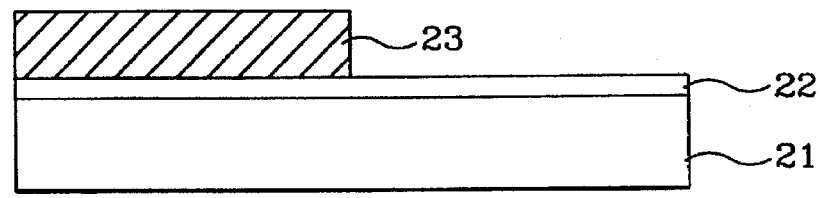
FIGS. 11 to 18 are cross-sectional views of a semiconductor device showing a sequence of steps in forming a contact of a semiconductor device, according to a third embodiment of the present invention.

As shown in FIG. 11, a first film 22 is deposited to a predetermined thickness on a semiconductor substrate 21. A first photoresist pattern 23 is formed on the first film 22 so as to expose a predetermined portion of first film 22. For the first film 22, an insulating film having a relatively lower etch rate is used, and is preferably a nitride film, an oxynitride film or a metal oxide film.

Figure 12:
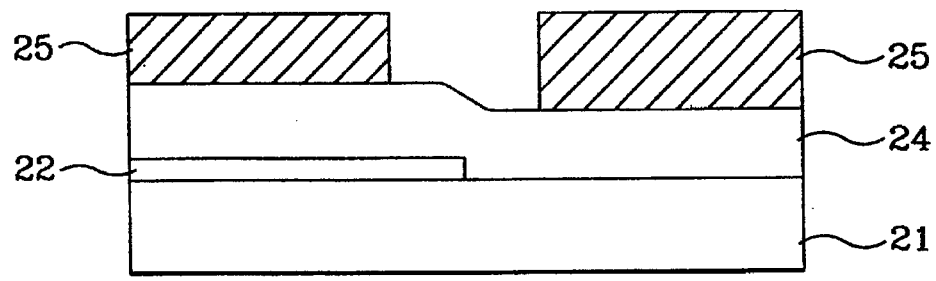

After etching the first film 22 using the first photoresist pattern 23, as shown in FIG. 12, the first photoresist pattern 23 is removed. This leaves a portion of the first film remaining on the substrate with a boundary between an edge portion of the first film 22 and the substrate 21. Afterward, a second film 24 is deposited to a thickness sufficient to fill the entire resultant structure. The second film 24 is an insulating film having a faster etch rate than that of the first film 22. Next, a second photoresist pattern 25 is formed on the second film 24 using a conventional or any selected photolithograpy process, as shown in FIG. 12. The second photoresist pattern 25 has a pattern which can expose the edge portion of first film 22 by the extent of etched second film 24 according to the subsequent etching process. It is preferable that the width of second Photoresist pattern 25 has the same size as the minimum line width which can be exposed through the conventional or selected exposure equipment.

Figure 13:
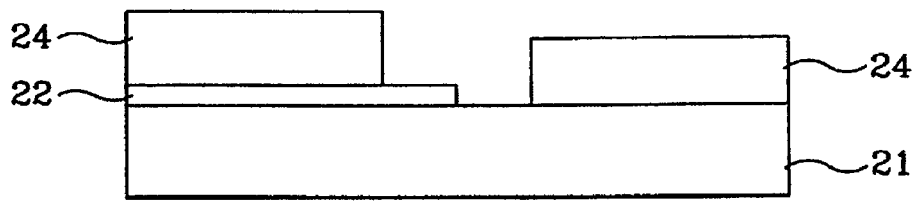

Referring to FIG. 13, in order to expose the edge portion of the first film 22, the second film 24 is anisotropically etched according to the shape of second photoresist pattern 25. At this time, because the second film 24 has a faster etch rate than that of the first film 22, first film 22 is hardly etched while only second film 24 is etched to expose a part of the substrate and the edge portion of the first film adjacent the exposed part of the substrate. Afterwards, the second photoresist pattern 25 is removed.

Figure 14:
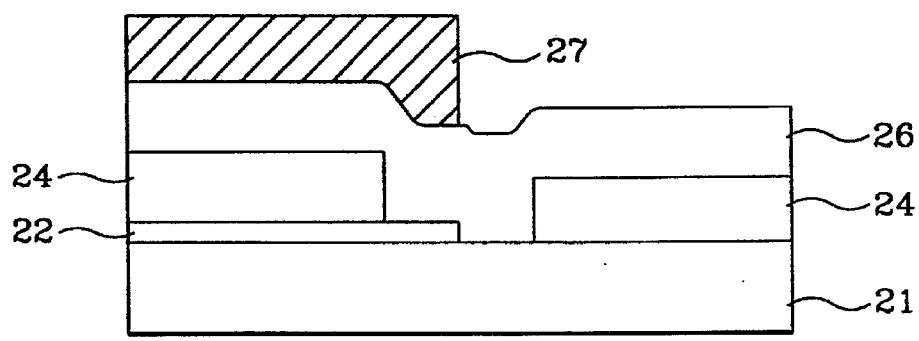
Figure 15:
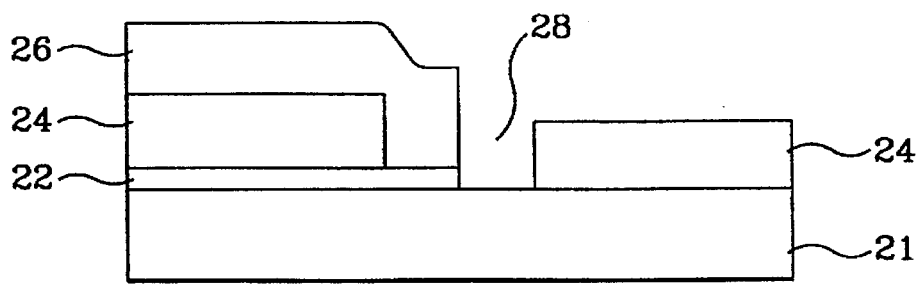

When the second photoresist pattern 25 is removed, a third film 26 is deposited to a thickness sufficient to fill the entire resultant structure, as shown in FIG. 14. The third film 26 is a film having a faster etch rate than those of the first film 22 and the second film 24.

Using the photolithography process, a third photoresist pattern 27 is formed on the third film 26. Preferably, the end of one side of third photoresist pattern 27 is formed so as to be in line with the etched boundary or border between the edge portion of the first film 22 and the semiconductor substrate 21. Accordingly, when the third film 26 is anisotropically dry etched as the shape of the third photoresist pattern 27, there is formed a contact hole 28 with a finer diameter than of that contact hole using the conventional on selected photolithography process. Furthermore, the semiconductor substrate 21 is exposed by contact hole 28. Then, the third photoresist pattern 27 is removed using the photolithography process.

Figure 16:
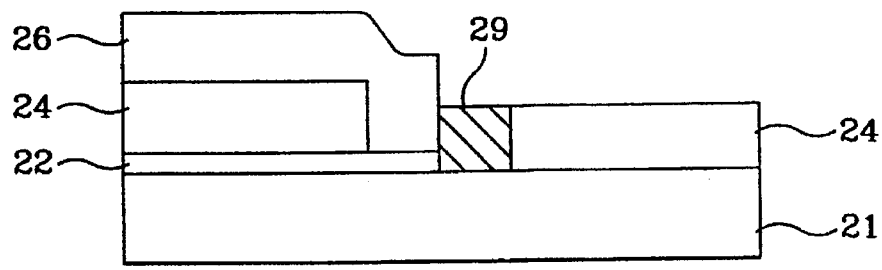

As shown in FIG. 16, the contact hole 28 is filled with a conductive metal material 29 (hereinafter, referred to a metal contact plug) through the selective metal deposition method. As a result, the lower substrate 21 forms a contact according to the metal contact plug 29.

Figure 17:
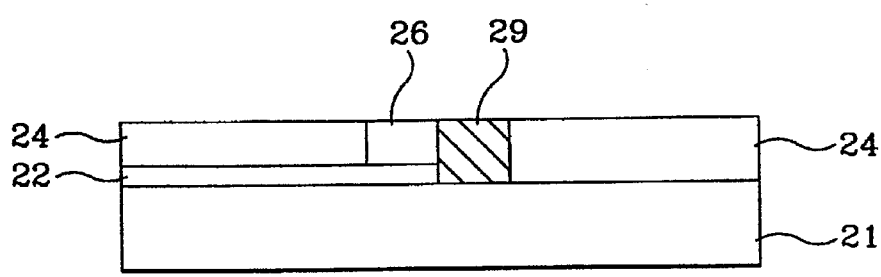

As shown in FIG. 17, through a chemical mechanical polishing method, the third film and second film may be polished until the upper surface of metal contact plug 29 is exposed, thereby obtaining a planarization of the surface.

Figure 18:
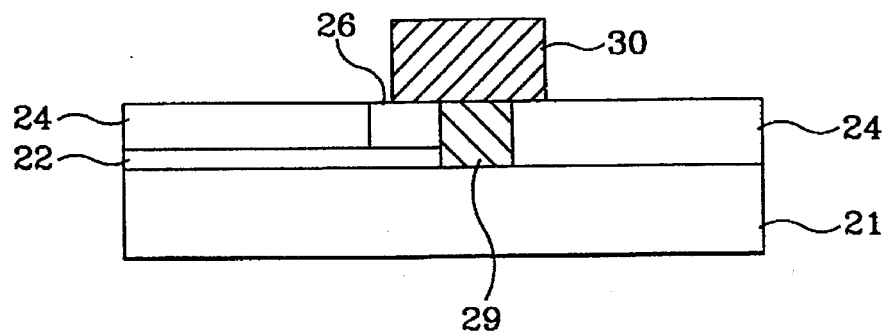

As shown in FIG. 18, after depositing a metal film on the resultant structure, the metal film is etched so as to be in contact with the filled metal material, thereby forming a metal interconnection line 30. At this time, aluminum or an aluminum alloy having a good conductive characteristic is used for the metal interconnection line 30.

According to the present invention as described above, among the films used for forming a semiconductor device, the films whose etch rates are different from one another are used to thereby form a contact hole having a finer size than that of a contact hole formed using the conventional on selected photolithography process. Therefore, a contact for a semiconductor device with higher integration is formed.

Although the invention has been shown and described with respect to a best mode embodiment thereof, it should be understood by those skilled in the art that the foregoing and various other changes, omissions and additions in the form and detail thereof may be made therein without departing from the spirit and scope of the invention.

What is claimed is:

1. A method for forming a contact of a semiconductor device, comprising the steps of:
    forming first and second films which are different from each other on a semiconductor substrate, and then forming a first photoresist pattern on the second film;

etching the second film using the first photoresist pattern, and then removing said first photoresist pattern to thereby form a first hole in a remainder of the second film;

forming a third film having an etch rate slower than etch rates of the first and the second films so as to fill the first hole and cover the remainder of the second film;

removing the third film covering the remainder of the second film until exposing said second film and said first hole filled with the third film;

forming a second photoresist pattern in order to expose only a limited area where the remainder of the second film and the first hole filled with the third film are in contact with each other;

etching said third, second and first films using the second photoresist pattern to expose said semiconductor substrate to thereby form a contact hole, and removing the second photoresist pattern;

forming a contact plug in said contact hole; and forming a metal interconnection line on at least one of said second and third films so as to make contact with said contact plug.

2. The method for forming a contact of a semiconductor device as claimed in claim 1, wherein said third film is an insulating layer selected from a group consisting of a nitride film, an oxynitride film, and a metal oxide film.

3. The method for forming a contact of a semiconductor device as claimed in claim 1, wherein said third film is a metal thin film.

4. The method for forming a contact of a semiconductor device as claimed in claim 1, wherein widths of said first and second photoresist patterns are a minimum distance which can be formed using selected exposure equipment, said first and second patterns being partially overlapped with each other.

5. The method for forming a contact of a semiconductor device as claimed in claim 1, wherein said contact plug is formed using a selective deposition method.

6. The method for forming a contact of a semiconductor device as claimed in claim 1, wherein said contact plug is conductive metal selected from a group consisting of tungsten, copper, aluminum, and an aluminum alloy.

7. The method for forming a contact of a semiconductor device as claimed in claim 1, further comprising, between said step of forming said contact plug and said step of forming said metal interconnection line on said contact plug, the step of polishing a surface of a structure remaining after said step of removing the second photoresist pattern for planarization, using a chemical mechanical polishing method.

8. The method for forming a contact of a semiconductor device as claimed in claim 1, wherein in said step of removing said third film, said third film is etched until said second film is exposed, according to an anisotropic blanket etching method.

9. The method for forming a contact of a semiconductor device as claimed in claim 1, wherein in said step of removing said third film, said third film is etched until said second film is exposed, according to a chemical mechanical polishing method.

10. A method for forming a contact of a semiconductor device, comprising the steps of:

forming first and second films which are different from each other on a semiconductor substrate, and forming a first photoresist pattern on the second film;

etching said second film using the first photoresist pattern, and removing the first photoresist pattern to thereby form a first hole in a remainder of the second film;

forming a third film having an etch rate slower than etch rates of said first and second films so as to fill the first hole and cover the remainder of the second film;

removing the third film covering the remainder of the second film until exposing said second film and the first hole filled with the third film to form an entire resultant structure;

forming a fourth film having an etch rate faster than that of said third film on the entire resultant structure, in order to protect said third film;

forming a second photoresist pattern so as to expose said fourth film corresponding to a portion where said second and third films are in contact with each other;

etching said fourth, third, second and first films using said second photoresist pattern to thereby form a contact hole, and removing said second photoresist pattern;

removing an unetched portion of said fourth film, and then forming a contact plug in said contact hole; and forming a metal interconnection line so as to be in contact with said contact plug.

11. The method for forming a contact of a semiconductor device as claimed in claim 10, wherein said fourth film has an etch rate similar to those of said first and second films.

12. A method for forming a contact of a semiconductor device, comprising the steps of:

depositing a first film on a semiconductor substrate, and then etching a predetermined portion of said first film using a first photoresist pattern;

removing said first photoresist pattern and depositing a second film having an etch rate faster than that of said first film, on said first film and substrate;

forming a second photoresist pattern on said second film, etching the second film using said second photoresist pattern, to expose a part of said substrate and an adjacent part of said first film, and removing said second photoresist pattern to form an entire resultant structure;

depositing a third film having an etch rate faster than etch rates of said first and second films, on the entire resultant structure;

forming a third photoresist pattern having an edge aligned with a boundary between said substrate and said adjacent part of said first film;

etching said third film so as to expose said substrate thereby forming a contact hole;

forming a contact plug in said contact hole; and forming a metal interconnection line so as to be in contact with said contact plug.

13. The method for forming a contact of a semiconductor device as claimed in claim 12, wherein said first film is a insulating film selected from a group consisting of a nitride film, an oxynitride film and a metal oxide film.

14. The method for forming a contact of a semiconductor device as claimed in claim 12, wherein a width of said second photoresist pattern is a minimum line width which can be formed using selected exposure equipment.

15. The method for forming a contact of a semiconductor device as claimed in claim 12, further comprising, between said step of forming said contact plug and said step of forming said metal interconnection line on said contact plug, the step of polishing a surface of a structure remaining after said step of forming said contact plug in said contact hole for planarization, using a chemical mechanical polishing method.

* * * * *

UNITED STATES PATENT AND TRADEMARK OFFICE
CERTIFICATE OF CORRECTION

PATENT NO.　：　5,648,298
DATED　　　：　July 15, 1997
INVENTOR(S)：　G. CHO

It is certified that error appears in the above-identified patent and that said Letters Patent is hereby corrected as shown below:

At column 2, line 33, after "third film", please insert --are--; and at line 57, after "third", please insert --film--; and at line 58, after "exposed", please cancel "film".

At column 4, line 61, please cancel "on" and substitute --or--.

At column 5, line 65, prior to "shown", please insert --also--.

At column 6, line 28, please cancel "on" and substitute --or--; and at line 52, please cancel "on" and substitute --or--.

Signed and Sealed this

Eleventh Day of November, 1997

*Attest:*

BRUCE LEHMAN

*Attesting Officer*　　*Commissioner of Patents and Trademarks*